(12) United States Patent
Kim et al.

(10) Patent No.: US 11,592,478 B2
(45) Date of Patent: Feb. 28, 2023

(54) SEMICONDUCTOR PACKAGE TEST SYSTEM AND SEMICONDUCTOR PACKAGE FABRICATION METHOD USING THE SAME

(71) Applicant: SAMSUNG ELECTRONICS CO., LTD., Suwon-si (KR)

(72) Inventors: Jaehong Kim, Seoul (KR); Se-Hyun Seo, Hwaseong-si (KR); Hyungil Kim, Asan-si (KR); Sangjae Rhee, Seongnam-si (KR); Youngchyel Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 85 days.

(21) Appl. No.: 17/337,066

(22) Filed: Jun. 2, 2021

(65) Prior Publication Data
US 2022/0026488 A1    Jan. 27, 2022

(30) Foreign Application Priority Data
Jul. 24, 2020  (KR) .................. 10-2020-0092532

(51) Int. Cl.
    *G01R 31/28*   (2006.01)
    *H01L 21/78*   (2006.01)
    (Continued)

(52) U.S. Cl.
    CPC ..... *G01R 31/2896* (2013.01); *G01R 31/2856* (2013.01); *G01R 31/2862* (2013.01);
    (Continued)

(58) Field of Classification Search
    CPC ................ G01R 1/0491; G01R 31/265; G01R 31/318511; G01R 33/0047; H01L 33/48; H01L 2933/0033
    See application file for complete search history.

(56) References Cited

U.S. PATENT DOCUMENTS

| 8,330,482 B2 | 12/2012 | Scocchetti |
| 9,494,618 B2 | 11/2016 | Preston et al. |

(Continued)

FOREIGN PATENT DOCUMENTS

| KR | 1020100031299 | 3/2010 |
| KR | 10-1838806 | 3/2018 |

(Continued)

*Primary Examiner* — Tung X Nguyen
(74) *Attorney, Agent, or Firm* — F. Chau & Associates, LLC

(57) ABSTRACT

A semiconductor package test system includes a test pack on which a semiconductor package is loaded, and a semiconductor package testing apparatus. The semiconductor package testing apparatus includes a receiving section that receives the test pack. The receiving section includes a pack receiving slot into which the test pack is inserted. The test pack includes a chuck on which the semiconductor package is fixed, a probe block disposed above the chuck, and a connection terminal. The receiving section includes a receiving terminal that is electrically connected to the connection terminal when the receiving terminal contacts the connection terminal. The probe block includes at least one needle configured to be electrically connected to the semiconductor package disposed on the chuck upon the chuck moving toward the semiconductor package. The receiving section is provided in plural.

20 Claims, 19 Drawing Sheets

(51) Int. Cl.
  *H01L 21/66*      (2006.01)
  *H01L 25/065*     (2023.01)
  *H01L 23/00*      (2006.01)

(52) U.S. Cl.
  CPC ..... *G01R 31/2863* (2013.01); *G01R 31/2865* (2013.01); *G01R 31/2868* (2013.01); *G01R 31/2875* (2013.01); *G01R 31/2877* (2013.01); *H01L 21/78* (2013.01); *H01L 22/32* (2013.01); *H01L 22/34* (2013.01); *H01L 24/16* (2013.01); *H01L 25/0652* (2013.01); *H01L 2224/16147* (2013.01); *H01L 2224/16237* (2013.01); *H01L 2225/0652* (2013.01); *H01L 2225/06513* (2013.01); *H01L 2225/06517* (2013.01); *H01L 2225/06541* (2013.01); *H01L 2225/06548* (2013.01); *H01L 2924/1431* (2013.01); *H01L 2924/1434* (2013.01)

(56) References Cited

U.S. PATENT DOCUMENTS

| | | |
|---|---|---|
| 10,553,454 B2 | 2/2020 | Schweikert et al. |
| 2011/0275170 A1* | 11/2011 | Van Wagenen .. G01R 31/31907 702/117 |
| 2018/0197762 A1 | 7/2018 | Cojocneanu et al. |
| 2019/0355436 A1 | 11/2019 | Shin |
| 2020/0049765 A1 | 2/2020 | Hwang |
| 2020/0049767 A1 | 2/2020 | Kim et al. |
| 2022/0043052 A1* | 2/2022 | Tsai ................... G01R 31/2856 |

FOREIGN PATENT DOCUMENTS

| | | |
|---|---|---|
| KR | 1020200016680 | 2/2020 |
| KR | 1020200016681 | 2/2020 |

* cited by examiner

US 11,592,478 B2

1

SEMICONDUCTOR PACKAGE TEST SYSTEM AND SEMICONDUCTOR PACKAGE FABRICATION METHOD USING THE SAME

CROSS-REFERENCE TO RELATED APPLICATIONS

This U.S. nonprovisional application claims priority under 35 U.S.C. § 119 to Korean Patent Application No. 10-2020-0092532, filed on Jul. 24, 2020 in the Korean Intellectual Property Office, the disclosure of which is hereby incorporated by reference in its entirety.

TECHNICAL FIELD

Embodiments of the present inventive concept relate to a semiconductor package test system and a semiconductor package fabrication method using the same, and more particularly, to a semiconductor package test system capable of quickly testing a large quantity of semiconductor packages and a semiconductor package fabrication method using the same.

DISCUSSION OF RELATED ART

A semiconductor package is provided to implement an integrated circuit chip for use in electronic products. In general, a semiconductor package may be fabricated by mounting a semiconductor chip on a substrate such as a printed circuit board (PCB). A single semiconductor package may have a plurality of mounted semiconductor chips. For example, a 2.5D package may have a high bandwidth memory and a logic chip that are mounted on a single substrate. A semiconductor package test apparatus may be used to test performance of the semiconductor package.

SUMMARY

Embodiments of the present inventive concept provide a semiconductor package test system capable of quickly testing a large quantity of semiconductor packages, and a semiconductor package fabrication method using the same.

Embodiments of the present inventive concept provide a semiconductor package test system capable of reducing test time, and a semiconductor package fabrication method using the same.

Embodiments of the present inventive concept provide a semiconductor package test system capable of increasing a yield, and a semiconductor package fabrication method using the same.

Embodiments of the present inventive concept provide a semiconductor package test system capable of performing a test process on a semiconductor package at various temperature ranges, and a semiconductor package fabrication method using the same.

According to embodiments of the present inventive concept, a semiconductor package test system includes a test pack on which a semiconductor package is loaded, and a a semiconductor package testing apparatus. The semiconductor package testing apparatus includes a receiving section that receives the test pack. The receiving section includes a pack receiving slot into which the test pack is inserted. The test pack includes a chuck on which the semiconductor package is fixed, a probe block disposed above the chuck, and a connection terminal. The receiving section includes a receiving terminal that is electrically connected to the connection terminal when the receiving terminal contacts the

2 connection terminal. The probe block includes at least one needle configured to be electrically connected to the semiconductor package disposed on the chuck upon the chuck moving toward the semiconductor package. The receiving section is provided in plural.

According to embodiments of the present inventive concept, a semiconductor package test system includes a test pack on which a memory is loaded, and a semiconductor package testing apparatus. The semiconductor package testing apparatus includes a receiving section that receives the test pack. The receiving section includes a pack receiving slot into which the test pack is inserted. The receiving section is provided in plural, and the plurality of receiving sections is vertically stacked in the semiconductor package testing apparatus. The test pack includes a chuck on which the memory is fixed. The chuck includes a vacuum hole that fixes the memory to the chuck.

According to embodiments of the present inventive concept, a semiconductor package fabrication method includes cutting a wafer into a divided semiconductor package, placing the divided semiconductor package on a chuck of a test pack, inserting the test pack into a pack receiving slot in a receiving section of a semiconductor package testing apparatus, and testing the semiconductor package disposed on the test pack using the semiconductor package testing apparatus. Testing the semiconductor package includes moving a needle of a probe block toward the semiconductor package such that the needle contacts the semiconductor package, applying a test power from the semiconductor package testing apparatus to the test pack, and performing a test on the semiconductor package using the test power.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1:
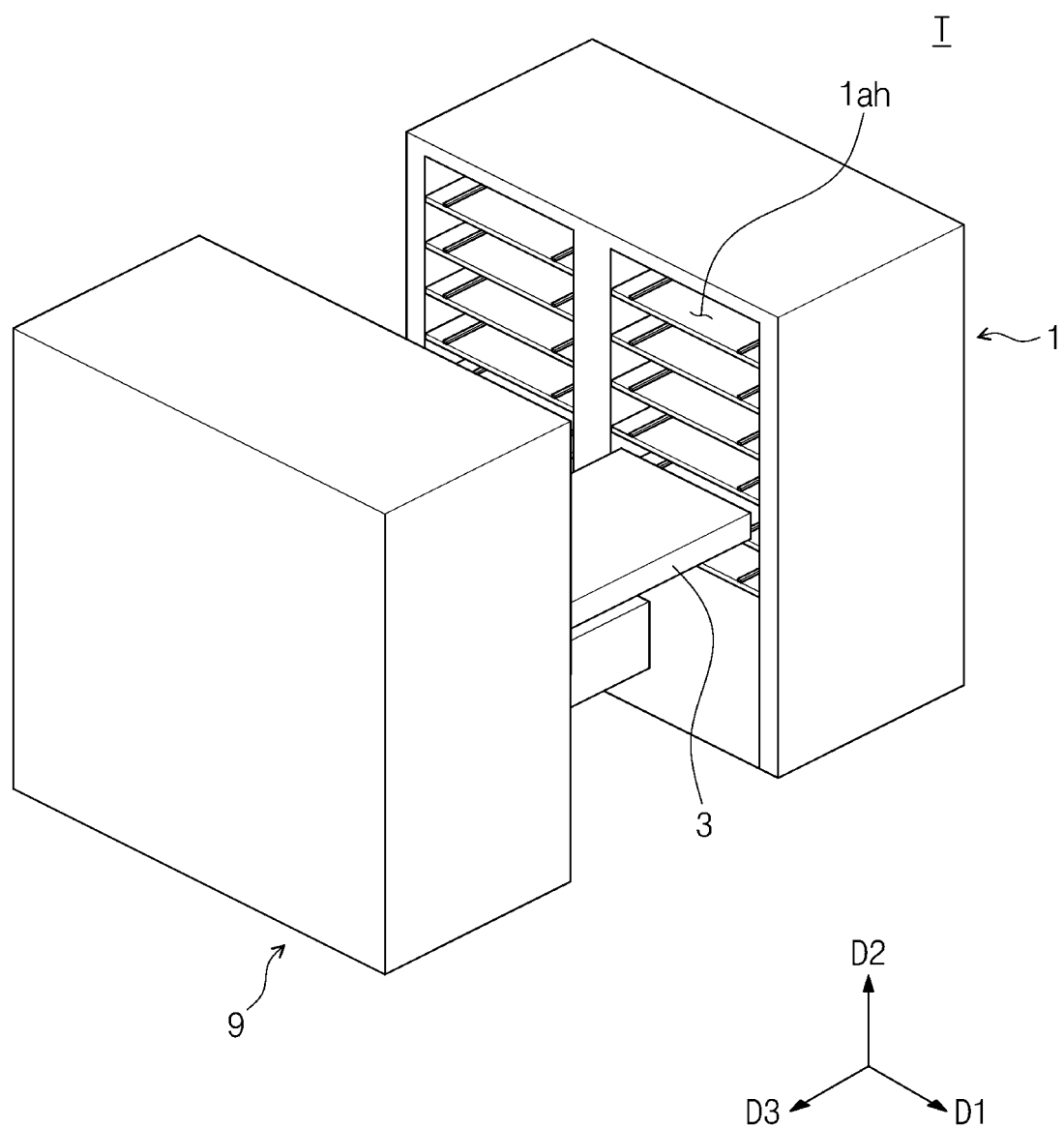
FIG. 1 illustrates a perspective view showing a semiconductor package test system according to embodiments of the present inventive concept.

Embodiments of the present inventive concept will be described more fully hereinafter with reference to the accompanying drawings. Like reference numerals may refer to like elements throughout the accompanying drawings.

The terms "first," "second," "third," etc. are used herein to distinguish one element from another, and the elements are not limited by these terms. Thus, a "first" element in an embodiment may be described as a "second" element in another embodiment.

Descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

When a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. Other words used to describe the relationships between components should be interpreted in a like fashion.

When two or more processes or events are described as being performed substantially simultaneously or occurring at substantially the same time, it is to be understood that the processes or events may be performed at or may occur at exactly the same time, or at about the same time as would be understood by a person having ordinary skill in the art. For example, the processes or events may be performed at or may occur at about the same time within a measurement error as would be understood by a person having ordinary skill in the art.

The term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

FIG. 1 illustrates a perspective view showing a semiconductor package test system according to embodiments of the present inventive concept.

Herein, D1, D2, and D3 may be respectively called a first direction, a second direction, and a third direction that intersects the first and second directions.

Referring to FIG. 1, a semiconductor package test system T may be provided. The semiconductor package test system T may be a system for testing a semiconductor package. The term "semiconductor package" used in this description may indicate a semiconductor device after a wafer sawing process in semiconductor fabrication. That is, the term "semiconductor package" may refer to a semiconductor device that is obtained by performing a wafer sawing process during semiconductor fabrication. Therefore, every test which will be performed after the wafer sawing process may be called a semiconductor package test.

The semiconductor package test system T may include a tester 1, a test pack 3, and a shifter 9.

The tester 1 may include an apparatus that performs the semiconductor package test. In embodiments, the tester 1 may supply a power utilized for performing the semiconductor package test. The tester 1 may provide a pack receiving slot 1ah. The test pack 3 may be inserted into the pack receiving slot 1ah. When the test pack 3 is inserted into the pack receiving slot 1ah, the tester 1 may supply the test pack 3 with a test power. The semiconductor package test may be performed under a state in which the test pack 3 is inserted into the tester 1. The pack receiving slot 1ah may be provided in plural. In embodiments, the plurality of pack receiving slots 1ah may be stacked vertically. For example, the tester 1 may have a rack shape in which the plurality of pack receiving slots 1ah is stacked vertically. Embodiments of the present inventive concept, however, are not limited thereto. For example, in embodiments, the tester 1 may have a shape in which the plurality of pack receiving slots 1ah is horizontally arranged. A detailed description thereof will be further provided below with reference to FIG. 2.

The test pack 3 may include a tool on which a semiconductor package is disposed. After a semiconductor package has been disposed on the test pack 3, the test pack 3 may be combined with the tester 1. For example, the pack receiving slot 1ah may receive the test pack 3 on which a plurality of semiconductor packages is disposed. That is, after a semiconductor package has been disposed on the test pack 3, the test pack 3 may be inserted into one of the pack receiving slots 1ah. The test pack 3 may be provided in plural. For example, the number of the test packs 3 may be identical to the number of the pack receiving slots 1ah. A test may be substantially simultaneously performed on a plurality of semiconductor packages under a state in which the test packs 3 are correspondingly inserted into the pack receiving slots 1ah.

The shifter 9 may shift the test pack 3. For example, the shifter 9 may drive the test pack 3 to move the test pack 3 toward the corresponding pack receiving slot 1ah of the tester 1. In embodiments, the shifter may include a motor that drives the test pack 3, and thus, may also be referred to herein as a motorized shifter. In embodiments, the shifter 9 may include an automated guided vehicle (AGV). The shifter 9 may move a plurality of test packs 3 at substantially the same time. The plurality of test packs 3 may be substantially simultaneously inserted into the tester 1.

Figure 2:
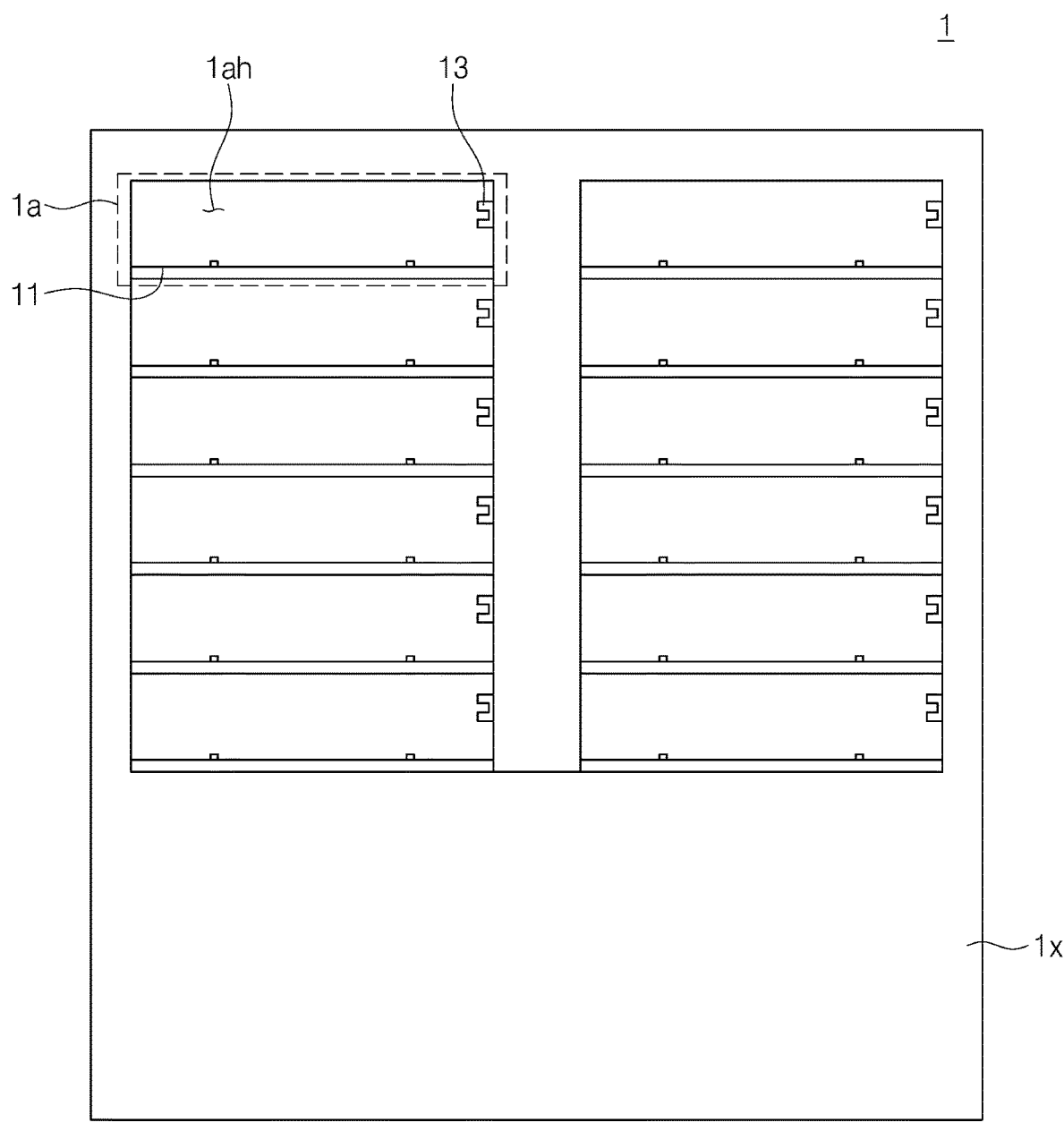
FIG. 2 illustrates a front view showing a semiconductor package test system according to embodiments of the present inventive concept.

FIG. 2 illustrates a front view showing a semiconductor package test system according to embodiments of the present inventive concept.

Referring to FIG. 2, the tester 1 may include an apparatus housing 1x and a receiving section 1a.

The apparatus housing 1x may form an appearance of the tester 1. The tester 1 may also be referred to herein as a semiconductor package testing apparatus. The apparatus housing 1x may support the receiving section 1a. The apparatus housing 1x may include a power supply that supplies a test power.

The receiving section 1a may mean a space that accommodates the test pack 3 (see FIG. 1). A single test pack 3 may be disposed in one receiving section 1a. The receiving section 1a may provide the pack receiving slot 1ah. That is, the pack receiving slot 1ah may be disposed in the receiving section 1a. The test pack 3 may be inserted into the pack receiving slot 1ah. The receiving section 1a may include a support plate 11 and a receiving terminal 13.

The support plate 11 may support the test pack 3 inserted into the pack receiving slot 1ah. The support plate 11 will be further described in detail below with reference to FIG. 11.

The receiving terminal 13 may be electrically connected to the test pack 3. For example, when the test pack 3 is inserted into the pack receiving slot 1ah, the test pack 3 and the receiving terminal 13 may be electrically connected to each other. The test power may be supplied through the receiving terminal 13 to the test pack 3. In embodiments, the receiving section 1a may be provided in plural. For example, the plurality of receiving sections 1a may be stacked vertically. In this case, the plurality of receiving sections 1a may be stacked in the second direction D2. The tester 1 may have a rack shape in which the plurality of receiving sections 1a is stacked vertically. Thus, the tester 1 may also be referred to herein as a semiconductor package testing rack. Embodiments of the present inventive concept, however, are not limited thereto. For example, in embodiments, the receiving sections 1a may be spaced apart from each other in the first direction D1. In an embodiment, the plurality of vertically stacked receiving sections 1a may be horizontally arranged in two or more rows. In an embodiment, the receiving sections 1a are not stacked vertically, but rather, may be arranged in only a horizontal direction alone. In embodiments, the plurality of receiving sections 1a may be modular components that can be conveniently assembled to each other and disassembled from each other. For example, the plurality of receiving sections 1a may be disassembled from each other, and then may be stacked in a vertical direction or arranged in a horizontal direction. When the receiving section 1a is a modular component, a process space may be flexibly utilized, and space efficiency may be increased.

Figure 3:
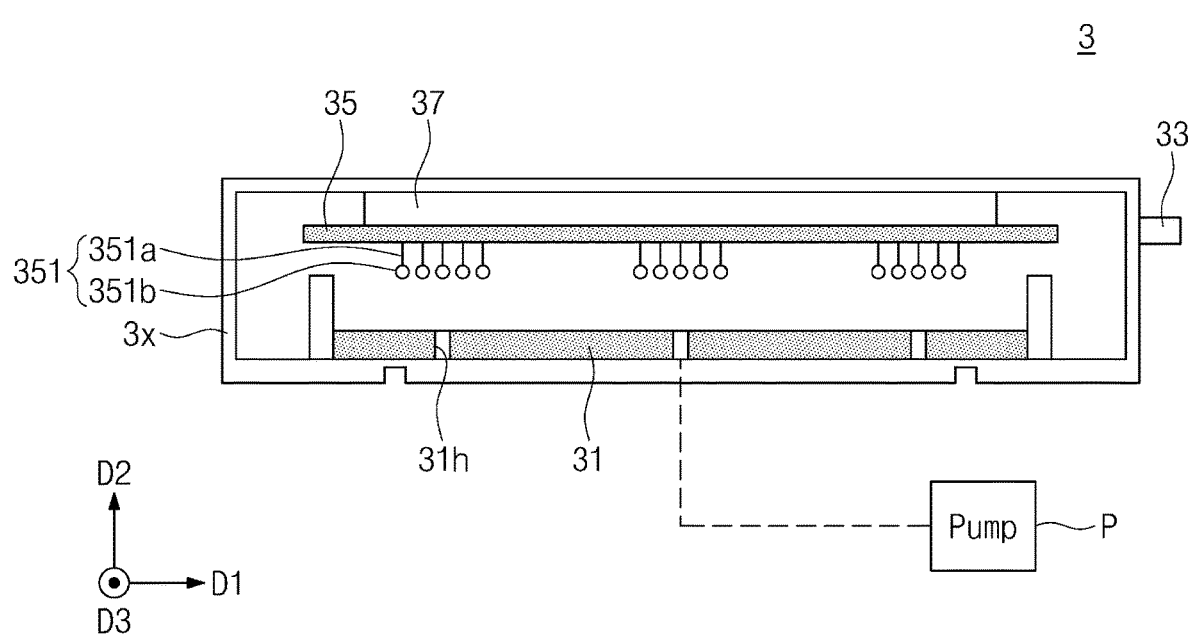
FIG. 3 illustrates a front view showing a test pack according to embodiments of the present inventive concept.

FIG. 3 illustrates a front view showing a test pack according to embodiments of the present inventive concept.

Referring to FIG. 3, the test pack 3 may include a pack housing 3x, a chuck 31, a connection terminal 33, a test substrate 37, and a probe block 35.

The pack housing 3x may form an appearance of the test pack 3. The components constituting the test pack 3 may be disposed within the pack housing 3x. For example, the pack housing 3x may form an enclosure in which the components constituting the test pack 3, which are described further below, are fixedly disposed. Accordingly, the test pack 3, which has a shape defined by the pack housing 3x, may also be referred to herein as a test pack housing, a test pack enclosure, a test pack casing, a test pack frame, or a test pack package. The pack housing 3x may be opened at one side thereof. A semiconductor package may be introduced into or withdrawn from the opened side of the pack housing 3x. The pack housing 3x may rigidly fix the chuck 31, the connection terminal 33, the probe block 35, and the test substrate 37 in their proper positions. That is, in embodiments, the pack housing 3x may fixedly hold other components of the test pack 3. However, embodiments of the present inventive concept are not limited thereto. For example, in embodiments, the pack housing 3x may be omitted, and the probe block 35 and the test substrate 37 may be fixed to the chuck 31.

The chuck 31 may provide a top surface on which a semiconductor package is disposed. The chuck 31 may fixedly hold a semiconductor package. For example, the chuck 31 may use a vacuum adsorption principle to rigidly place a semiconductor package in its proper position. The chuck 31 may provide a vacuum hole 31h. The vacuum hole 31h may be connected to a vacuum pump P. A vacuum pressure may be provided from the vacuum pump P to the vacuum hole 31h. The vacuum pressure provided to the vacuum hole 31h may fixedly adsorb a semiconductor package disposed on the chuck 31. The vacuum hole 31h may be provided in plural. The plurality of vacuum holes 31h may be spaced apart from each other in a horizontal direction. Each of the plurality of vacuum holes 31h may adsorb one semiconductor package. Therefore, a plurality of semiconductor packages may be disposed on a single chuck 31. That is, in embodiments, a vacuum adsorption principle is employed to fixedly hold a semiconductor package disposed on the chuck 31. However, embodiments of the present inventive concept are not limited thereto. For example, in embodiments, instead of the vacuum adsorption principle, another principle may be adopted to fixedly hold a semiconductor package disposed on the chuck 31. A separate mechanical structure equipped on the chuck 31 may be used to rigidly place a semiconductor package in its proper position. The chuck 31 may move vertically to cause the semiconductor package disposed on the chuck 31 to be in contact (e.g., direct contact) with a needle 351b of a probe block 35, which is described in further detail below. A detailed description thereof will be further described below.

The connection terminal 33 may be coupled to the pack housing 3x. The connection terminal 33 may be in contact with the receiving terminal 13 (see FIG. 2). When the connection terminal 33 contacts the receiving terminal 13, the connection terminal 33 and the receiving terminal 13 may be electrically connected to each other. Various methods may be used to achieve contact between the connection terminal 33 and the receiving terminal 13. For example, the connection terminal 33 and the receiving terminal 13 may have a complementary shape to each other. Therefore, the connection terminal 33 and the receiving terminal 13 may be matingly physically coupled, and thus, electrically connected to each other. Embodiments of the present inventive concept, however, are not limited thereto. For example, in embodiments, the connection terminal 33 and the receiving terminal 13 may be in contact with each other in various other ways. The connection terminal 33 may be connected to the receiving terminal 13, and may thus be supplied with the test power from the tester 1 (see FIG. 2). The test power supplied through the connection terminal 33 may drive the probe block 35 and the test substrate 37 to perform the semiconductor package test.

The test substrate 37 may be a board that controls the semiconductor package test. For example, the test substrate 37 may include a built-out self-test (BOST) chip. The test substrate 37 may be programmed based on a field programmable gate array (FPGA). For example, the test substrate 37 may include a BOST chip programmed based on an FPGA. The test substrate 37 may be supplied with the test power. For example, the test substrate 37 may be supplied with the test power from the connection terminal 33. The test substrate 37 may be supplied with the test power to perform the semiconductor package test. The test substrate 37 may be coupled to the pack housing 3x. Although embodiments in which the test substrate 37 utilizes the BOST-type test to perform the semiconductor package test have been described, embodiments of the present inventive concept are not limited thereto. For example, in embodiments, the test substrate 37 may be omitted, and a built-in self-test (BIST) chip equipped in a semiconductor package may be used to perform the semiconductor package test. For example, when an external power is supplied, a test circuit (e.g., BIST) positioned in a semiconductor package may be used to perform a test process on a semiconductor package.

The probe block 35 may be a test tool that contacts a semiconductor package. The probe block 35 may also be referred to herein as a probe. The probe block 35 may have various shapes for connection with a semiconductor package. For example, the probe block 35 may include either a probe card that contacts a semiconductor device or a component configured similarly to the probe card. Embodiments of the present inventive concept, however, are not limited thereto. For example, in embodiments, the probe block 35 may be variously configured to have an electrical connection with a semiconductor package.

The probe block 35 may include a test needle 351. The test needle 351 may include a needle body 351a and a tip 351b. The needle body 351a may extend in a vertical direction. The tip 351b may be positioned at a lower side of the needle body 351a. The tip 351b may directly contact a pad of a semiconductor package. The probe block 35 may be connected to the test substrate 37. In an embodiment, the probe block 35 may be directly coupled to the test substrate 37. In an embodiment, the probe block 35 may be coupled to the test substrate 37 through a socket or a cable. The probe block 35 may be electrically connected to the test substrate 37. The probe block 35 may be supplied with the test power from the test substrate 37. The test power may be transmitted through the test needle 351 to a semiconductor package. The test needle 351 may be provided in plural. The test needles 351 may be spaced apart from each other in a horizontal direction.

Figure 4:
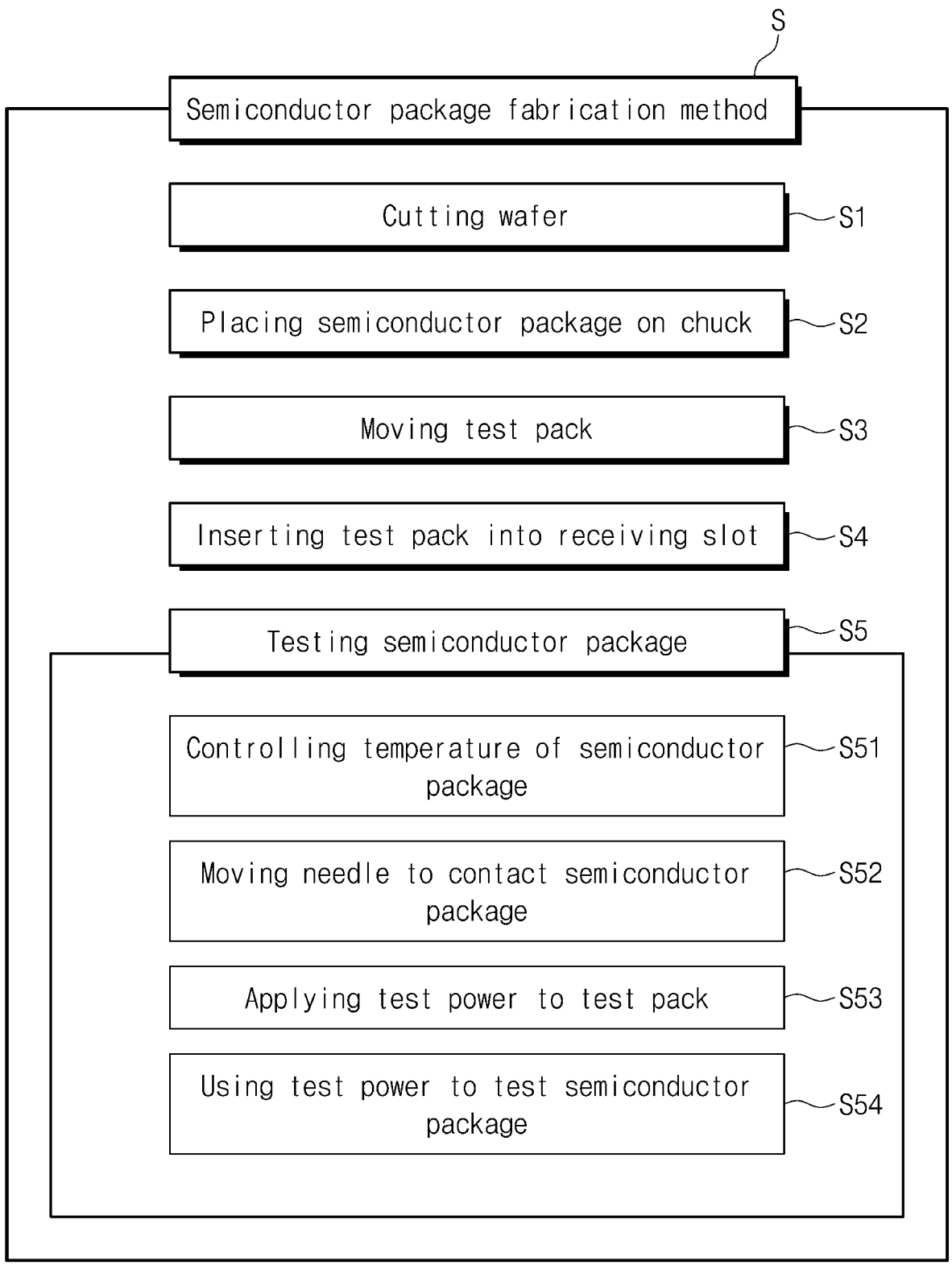
FIG. 4 illustrates a flow chart showing a semiconductor package fabrication method according to embodiments of the present inventive concept.

FIG. 4 illustrates a flow chart showing a semiconductor package fabrication method according to embodiments of the present inventive concept.

Referring to FIG. 4, a semiconductor package fabrication method S may include an operation 51 of cutting a wafer, an operation S2 of placing the cut semiconductor package on a chuck (e.g., the chuck 31), an operation S3 of moving a test pack (e.g., the test pack 3), an operation S4 of inserting the test pack (e.g., the test pack 3) into a pack receiving slot (e.g., the pack receiving slot 1ah), and an operation S5 of testing the semiconductor package.

The operation S5 of testing the semiconductor package may include an operation S51 of controlling a temperature of the semiconductor package, an operation S52 of moving a needle (e.g., the test needle 351) to contact the semiconductor package, an operation S53 of applying a test power to the test pack (e.g., the test pack 3), and an operation S54 of using the test power to test the semiconductor package.

The operation 51 of cutting a wafer may include sawing a semiconductor wafer into a semiconductor package shape. As described above, the semiconductor package may mean a semiconductor device after the wafer sawing process has been performed.

Other operations of the semiconductor package fabrication method S will be described below with reference to FIGS. 5 to 12.

Figure 5:
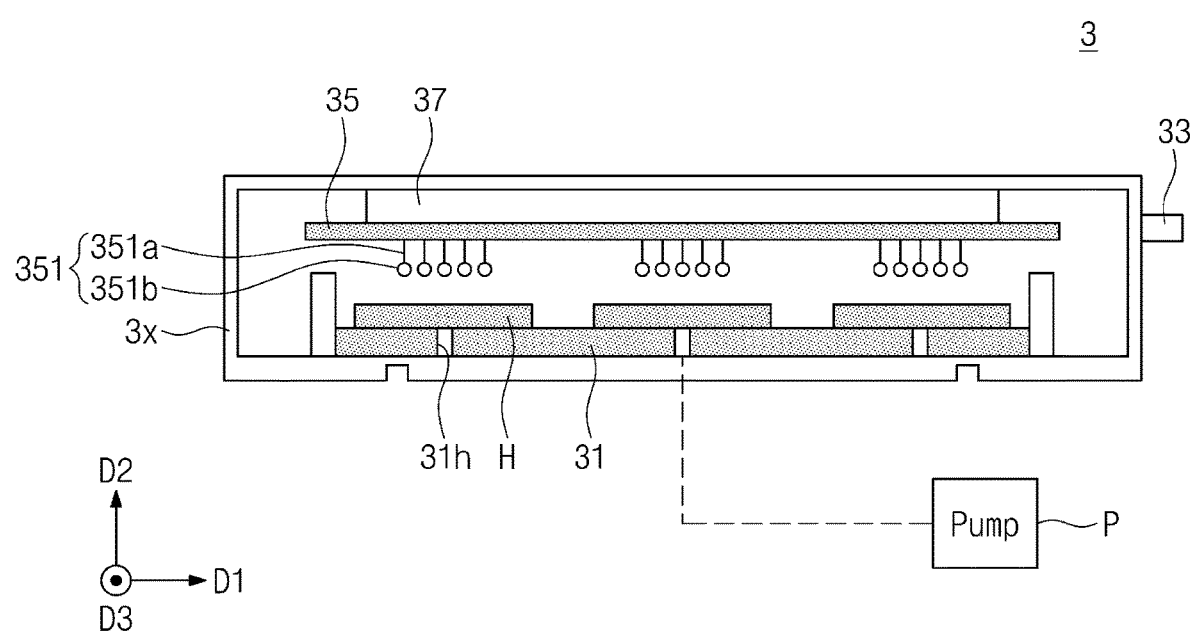
FIG. 5 illustrates a front view showing a semiconductor package disposed on a test pack to perform a semiconductor package test in accordance with a semiconductor package fabrication method according to embodiments of the present inventive concept.

FIG. 5 illustrates a front view showing a semiconductor package disposed on a test pack to perform a semiconductor package test in accordance with a semiconductor package fabrication method according to embodiments of the present inventive concept.

Referring to FIGS. 4 and 5, the operation S2 of placing a semiconductor package on a chuck may include arranging a plurality of semiconductor packages H on the chuck 31. The semiconductor package H may be disposed on the vacuum hole 31h. The vacuum hole 31h may be supplied with a vacuum pressure from the vacuum pump P. The vacuum pressure applied to the vacuum hole 31h may rigidly fix the semiconductor package H in a specific position on the chuck 31. Therefore, even when the test pack 3 moves, the semiconductor package H may be fixed to its proper position.

The semiconductor package H may include various types of semiconductor packages. For example, the semiconductor package H may include a memory such as, for example, a high bandwidth memory (HBM).

An example in which a high bandwidth memory (HBM) is adopted as the semiconductor package H will be described with reference to FIGS. 6 to 8.

Figure 6:
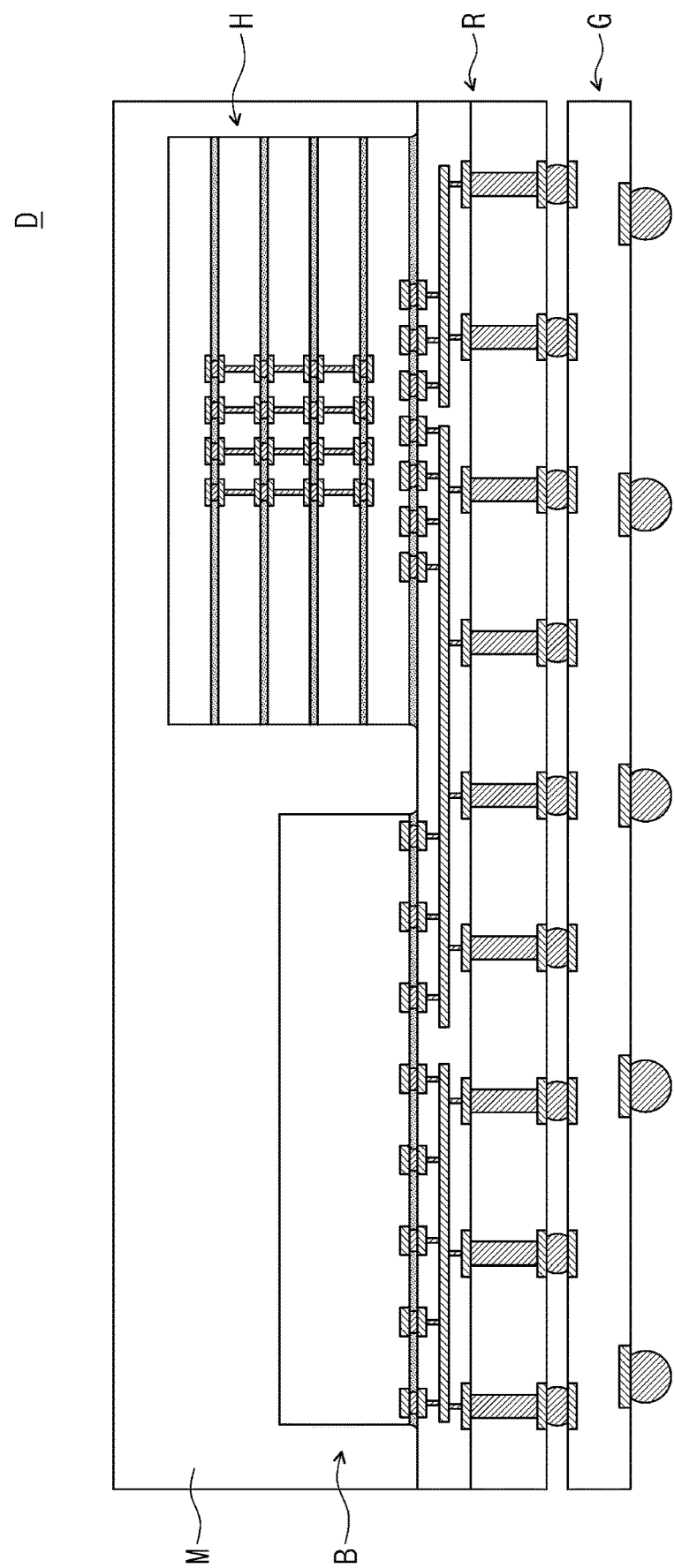
FIG. 6 illustrates a cross-sectional view showing a semiconductor package according to embodiments of the present inventive concept.

FIG. 6 illustrates a cross-sectional view showing a semiconductor package according to embodiments of the present inventive concept.

Referring to FIG. 6, a package D may be provided. In embodiments, the package D may include a 2.5D package. The package D may include a substrate G, an interposer R, a semiconductor package H, a logic chip B, and a molding layer M. The substrate G may include a printed circuit board (PCB). The substrate G may electrically connect the logic chip B to a component disposed outside of the package D. The interposer R may electrically connect the substrate G and the logic chip B to each other. The semiconductor package H may include a high bandwidth memory (HBM). The HBM may include a plurality of stacked memory chips. A detailed description thereof will be further described below. The logic chip B may control the semiconductor package H. For example, the logic chip B may include a graphic processing unit (GPU) and/or a central processing unit (CPU). The molding layer M may surround the logic chip B and the semiconductor package H.

Figure 7:
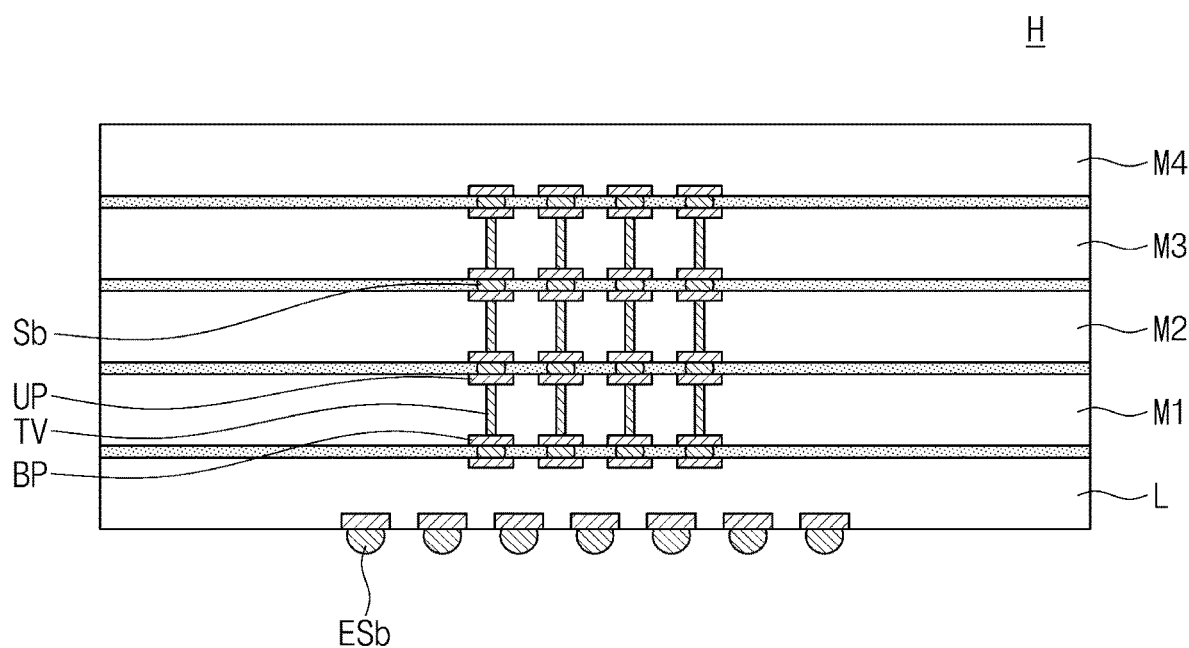
FIG. 7 illustrates a cross-sectional view showing a semiconductor package according to embodiments of the present inventive concept.

FIG. 7 illustrates a cross-sectional view showing a semiconductor package according to embodiments of the present inventive concept. FIG. 7 is a cross-sectional view of the semiconductor package H of FIG. 8 taken along line I-I'.

Referring to FIG. 7, the semiconductor package H may be a high bandwidth memory (HBM). The semiconductor package H may include a lower logic chip L, a first memory chip M1, a second memory chip M2, a third memory chip M3, and a fourth memory chip M4. The chips L and M1 to M4 may be stacked vertically. The vertically stacked chips L and M1 to M4 may be electrically connected to each other in a through silicon via (TSV) fashion. For example, a lower pad BP of an upper chip and an upper pad UP of a lower chip may be electrically connected to each other through an internal ball Sb (e.g., an internal solder ball). A single chip may be configured such that the upper pad UP and the lower pad BP are electrically connected to each other through a through via TV. An external solder ball ESb may be attached to a bottom surface of the logic chip L. The external solder ball ESb may electrically connect the semiconductor package H to a component outside of the semiconductor package H. The external solder ball ESb may have a small size. For example, the external solder ball ESb may have a diameter of about 30 μm. Embodiments of the present inventive concept, however, are not limited thereto.

Figure 8:
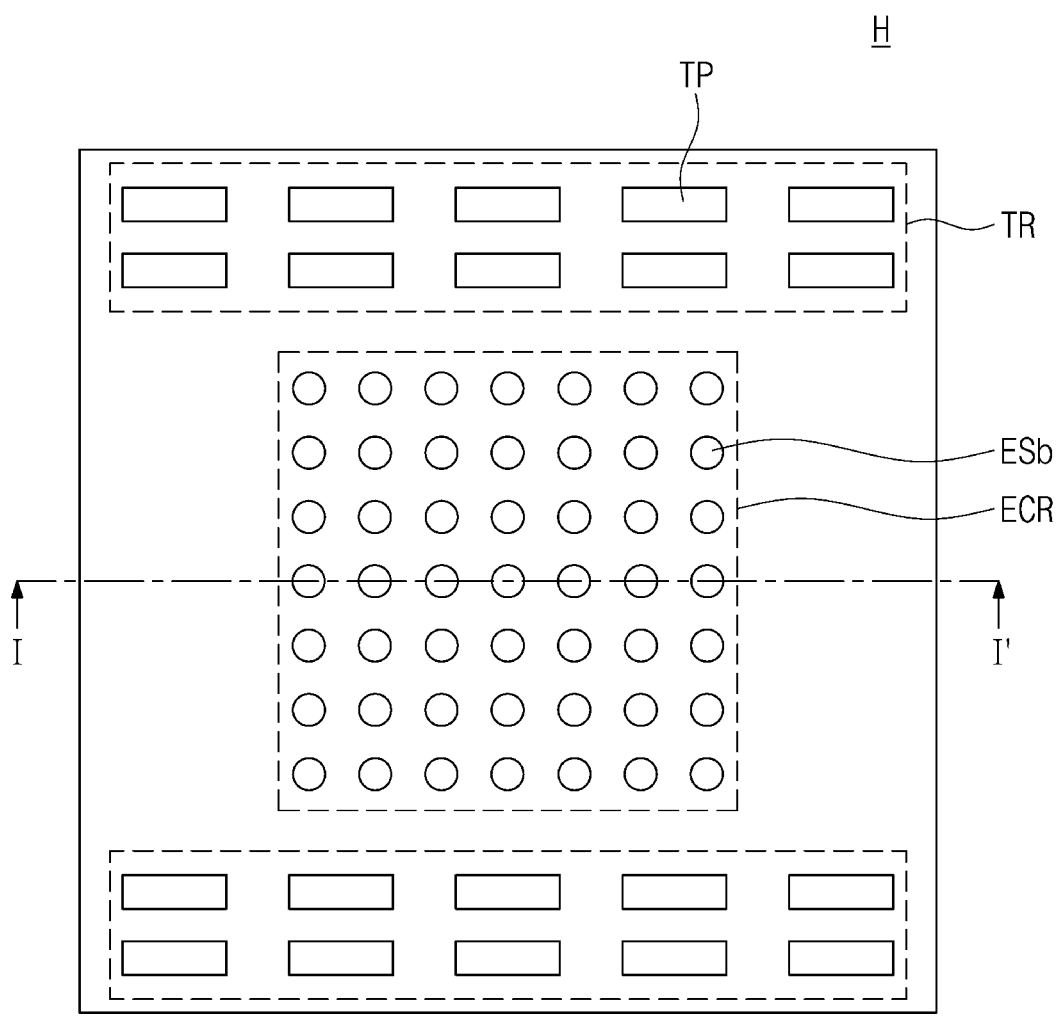
FIG. 8 illustrates a bottom view showing a semiconductor package according to embodiments of the present inventive concept.

FIG. 8 illustrates a bottom view showing a semiconductor package according to embodiments of the present inventive concept.

Referring to FIG. 8, the external solder ball ESb and a test pad TP may be exposed on a bottom surface of the semiconductor package H. The external solder ball ESb may be provided in plural. The plurality of external solder balls ESb may be concentrated in a central region of the bottom surface of the semiconductor package H. A solder ball region ECR may be defined and may refer to the central region on which the plurality of solder balls ESb are concentrated. The test pad TP may be larger than each of the external solder balls ESb. The test pad TP may be positioned on a relatively outer side of the bottom surface of the semiconductor package H. The test pad TP may serve as a pathway for a test power utilized to test the semiconductor package H. The test pad TP may be provided in plural. A test region TR may be defined and may refer to a region on which the plurality of test pads TP are positioned.

FIGS. 9 to 12 illustrate front views showing a manner in which a semiconductor package is tested in accordance with a semiconductor package fabrication method according to embodiments of the present inventive concept.

Figure 9:
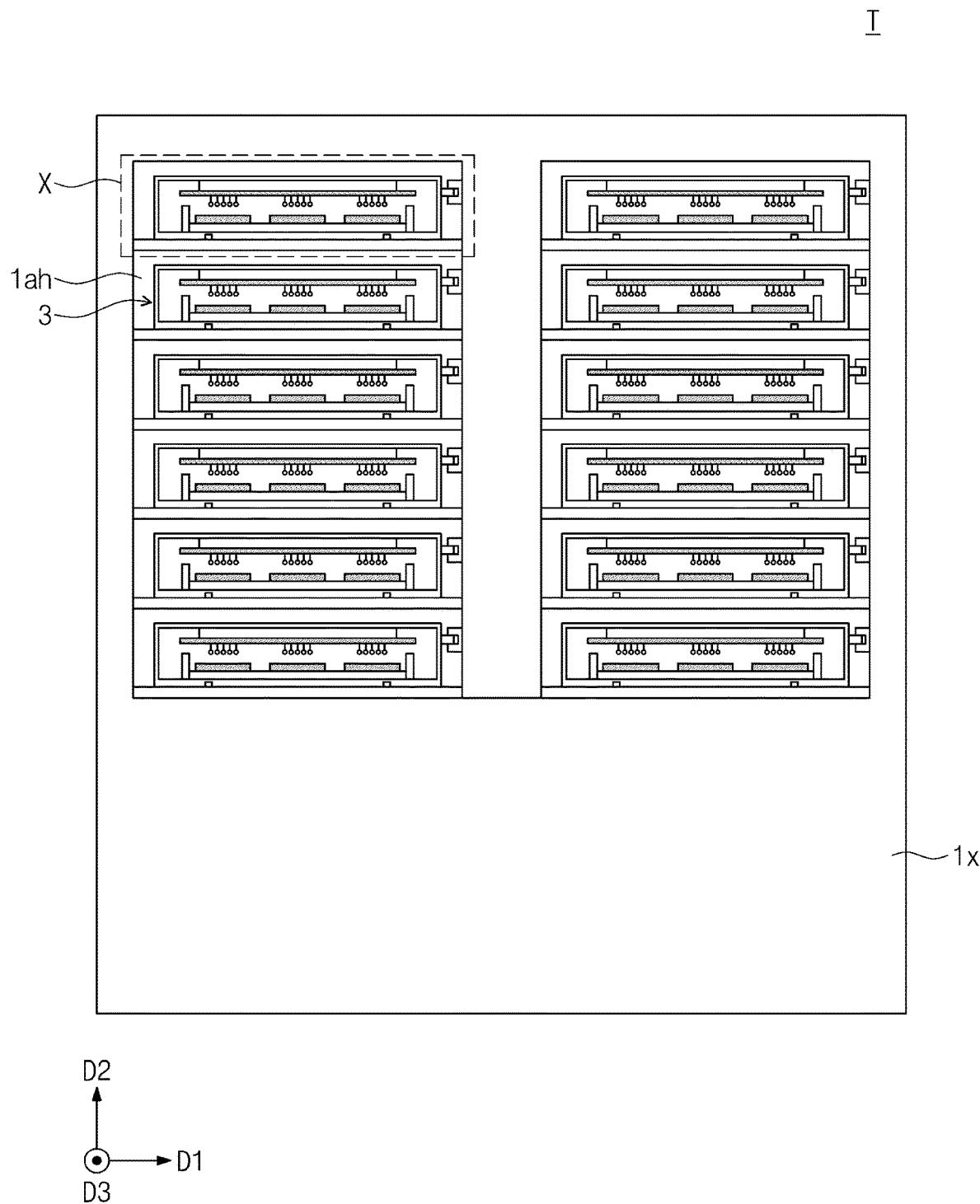
FIGS. 9 to 12 illustrate front views showing a manner in which a semiconductor package is tested in accordance with a semiconductor package fabrication method according to embodiments of the present inventive concept.

Referring to FIGS. 4 and 9, the operation S3 of moving a test pack may include using the shifter 9 (see FIG. 1) to move the test pack 3. In embodiments, a single shifter 9 may move a plurality of test packs 3 at substantially the same time.

The operation S4 of inserting the test pack into a pack receiving slot may include causing the shifter 9 to insert the test pack 3 into the pack receiving slot 1ah. When the test pack 3 is provided in plural, the plurality of test packs 3 may be inserted into corresponding pack receiving slots 1ah.

Figure 10:
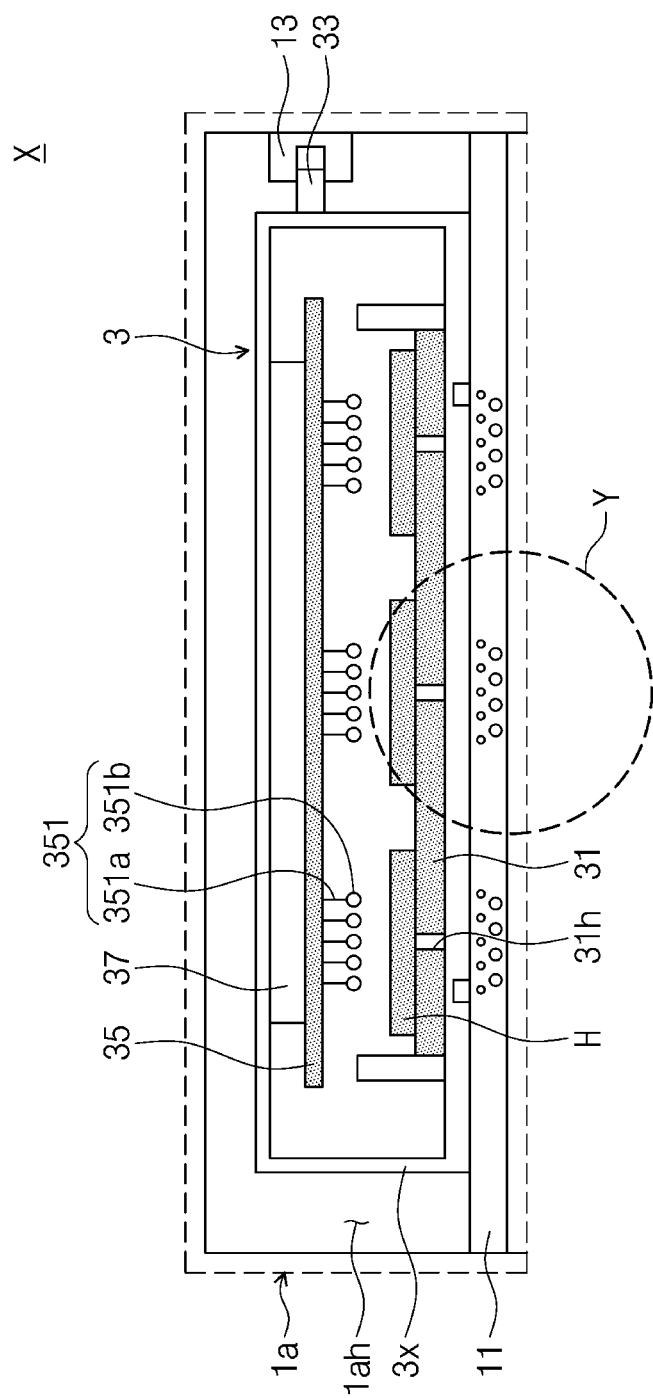

FIG. 10 is an enlarged view of the area X illustrated in FIG. 9.

Referring to FIG. 10, when the test pack 3 is inserted into the pack receiving slot 1ah, the connection terminal 33 may contact the receiving terminal 13. The connection terminal 33 may be disposed in a configuration such that it contacts (e.g., directly contacts) the receiving terminal 13 when the test pack 3 is inserted into the pack receiving slot 1ah. When the connection terminal 33 and the receiving terminal 13 contact each other, the connection terminal 33 and the receiving terminal 13 may be electrically connected to each other.

Referring to FIGS. 4 and 10, the operation S51 of controlling a temperature of the semiconductor package may include increasing or decreasing a temperature of the semiconductor package H disposed on the chuck 31. The support plate 11 may be used to control the temperature of the semiconductor package H.

Figure 11:
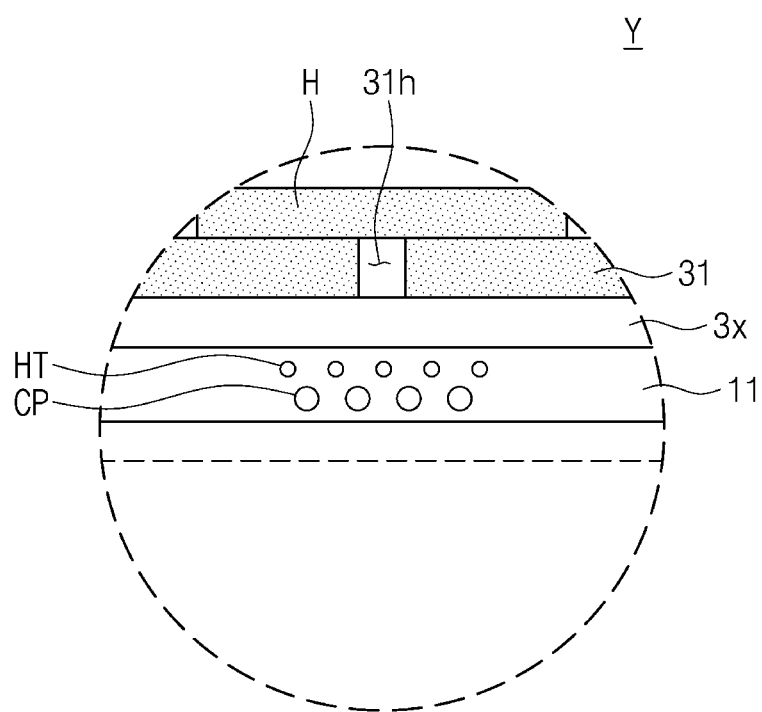

FIG. 11 is an enlarged view of area Y illustrated in FIG. 10.

Referring to FIG. 11, the support plate 11 may include a hot wire HT and a cooling path CP. For example, a set of hot wires HT may be provided in a lower portion of an area where a single semiconductor package H is disposed. In addition, a set of cooling paths CP may be provided in the lower portion of the area where a single semiconductor package H is disposed. In embodiments, when the hot wire HT is supplied with a power, the hot wire HT may increase a temperature of the semiconductor package H disposed on the hot wire HT to which the power is applied. The hot wire HT is not always hot, as the temperature of the hot wire HT depends on the power applied thereto. The hot wire HT may also be referred to herein as a temperature adjustment wire. Therefore, the semiconductor package H may be placed in a condition to undergo a test to measure performance of the semiconductor package H at high temperatures. In embodiments, when cooling water flows through the cooling path CP, the cooling water may reduce a temperature of the semiconductor package H disposed on the cooling path CP through which the cooling water flows. Therefore, the semiconductor package H may be placed into a condition to undergo a test to measure performance of the semiconductor package H at low temperatures.

The hot wire HT and the cooling path CP may be disposed in a position corresponding to where a plurality of semiconductor packages H are disposed. Accordingly, temperatures of the plurality of semiconductor packages H may be individually controlled in embodiments of the present inventive concept.

According to a semiconductor package and a semiconductor package fabrication method in accordance with embodiments of the present inventive concept, a test may be performed while controlling a temperature of a semiconductor package. For example, performance of the semiconductor package may be tested at room, high, and low temperatures according to embodiments of the inventive concept. Accordingly, the semiconductor package may be tested at various temperature ranges. As a result, reliability of the semiconductor package may be increased.

According to a semiconductor package and a semiconductor package fabrication method in accordance with embodiments of the present inventive concept, temperatures of a plurality of semiconductor packages may be separately controlled. Therefore, even though the plurality of semiconductor packages is tested at substantially the same time, the temperature of every semiconductor package may be separately and precisely controlled. Accordingly, the semiconductor package may be tested at various temperature ranges, and reliability of the semiconductor package may be increased.

Figure 12:
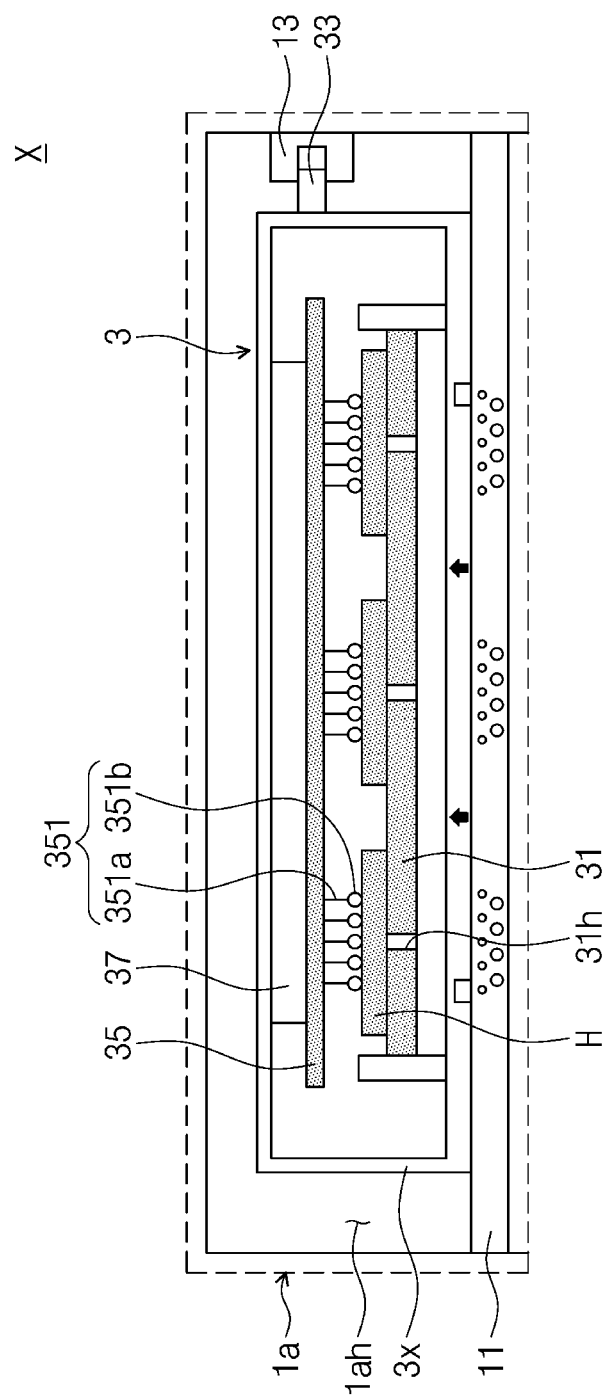

FIG. 12 illustrates an enlarged view of area X of FIG. 9.

Referring to FIGS. 4 and 12, the operation S52 of moving a needle to contact the semiconductor package may include elevating the chuck 31. When the chuck 31 ascends, the semiconductor package H may also ascend together with the chuck 31. The chuck 31 may ascend until a top surface of the semiconductor package H contacts the test needle 351.

For example, the chuck 31 may ascend until the test pad TP (see FIG. 8) of the semiconductor package H contacts the tip 351b of the test needle 351. FIG. 12 depicts the elevation of the chuck 31 alone, but embodiments of the present inventive concept are not limited thereto. For example, in embodiments, the support plate 11 of the receiving section 1*a* may also ascend together with the chuck 31.

The operation S53 of applying a test power to the test pack may include providing the test pack 3 with a test power from the tester 1. In embodiments, a power supply of the tester 1 may supply the test pack 3 with the test power. For example, under a state that the connection terminal 33 is in contact with the receiving terminal 13, the test power may be supplied from the power supply through the receiving terminal 13 to the connection terminal 33.

The operation S54 of using the test power to test the semiconductor package may include testing the semiconductor package H with the test substrate 37. The test power may be transmitted from the connection terminal 33 to the test substrate 37. The test substrate 37 may control the probe block 35 to test the semiconductor package H. For example, the test needle 351 of the probe block 35 may transmit the test power to the test pad TP (see FIG. 8) of the semiconductor package H, thereby sending and receiving a test signal. The test substrate 37 may control a test procedure.

According to a semiconductor package and a semiconductor package fabrication method in accordance with embodiments of the present inventive concept, a large quantity of semiconductor packages may undergo a test at substantially the same time. For example, because the test is substantially simultaneously executed in a plurality of receiving sections that are vertically stacked in a tester, a large quantity of semiconductor packages may be quickly tested in a narrow space. In this case, there may be a reduction in spatial volume required for testing the semiconductor package. In addition, the semiconductor package may be tested at high speeds, and the overall process time may be reduced. Therefore, a total inspection of the semiconductor package may be performed according to embodiments of the present inventive concept. As a result, reliability of the semiconductor package may be increased.

According to a semiconductor package and a semiconductor package fabrication method in accordance with embodiments of the present inventive concept, a test process may be performed by inserting a test pack into a tester after pre-loading of the semiconductor package on the test pack. In addition, because the test pack moves under a state in which the semiconductor package is stably fixed to a chuck, the semiconductor package inserted into the tester may be appropriately aligned for the test process. Therefore, the test process may be simplified and the test time may be reduced.

According to a semiconductor package and a semiconductor package fabrication method in accordance with embodiments of the present inventive concept, a test pack may include a built-out self-test (BOST) chip to test the semiconductor package. Therefore, all test processes may be performed on the semiconductor package. For example, according to embodiments of the inventive concept, in addition to performing a simple test process by using a built-in self-test (BIST) chip equipped in the semiconductor package, additional different test processes that utilize intricate circuits may also be performed.

According to a semiconductor package and a semiconductor package fabrication method in accordance with embodiments of the present inventive concept, a test substrate and a probe block may be positioned in a test pack. For example, a test pack with a small volume may have both the probe block and the test substrate disposed therein for testing a small quantity of semiconductor packages. In this case, in embodiments, automatic test equipment (ATE) is not required to test the semiconductor package. Therefore, there may be a reduction in spatial volume required for testing the semiconductor package. As a result, a plurality of semiconductor packages may be tested in a limited area.

Figure 13:
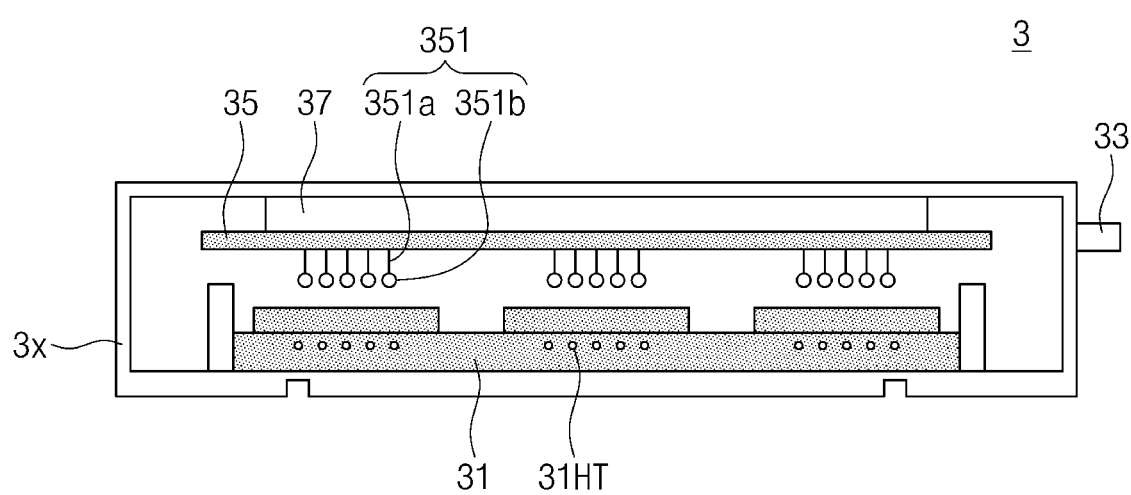
FIG. 13 illustrates a front view showing a test pack according to embodiments of the present inventive concept.

FIG. 13 illustrates a front view showing a test pack according to embodiments of the present inventive concept.

In the description that follows, for convenience of explanation, a further description of content substantially the same as or similar to content described with reference to FIGS. 1 to 12 may be omitted.

Referring to FIG. 13, a heater 31HT may be positioned in the chuck 31 of the test pack 3. For example, the chuck 31 may include the heater 31HT disposed therein. In this case, in embodiments, a heater is not separately disposed in the receiving section 1*a* (see FIG. 2) of the tester 1 (see FIG. 2).

Figure 14:
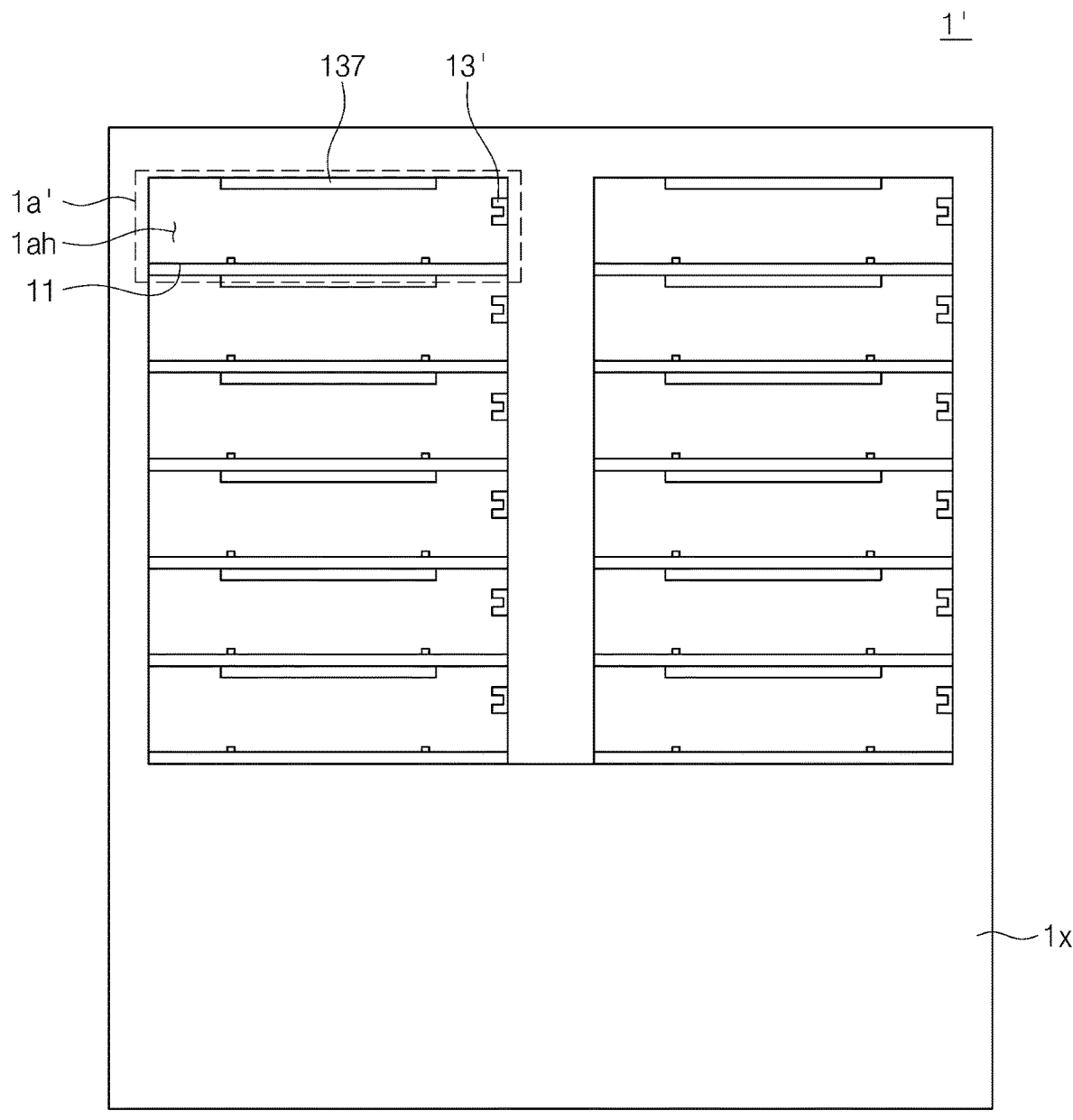
FIG. 14 illustrates a front view showing a semiconductor package test system according to embodiments of the present inventive concept.
Figure 15:
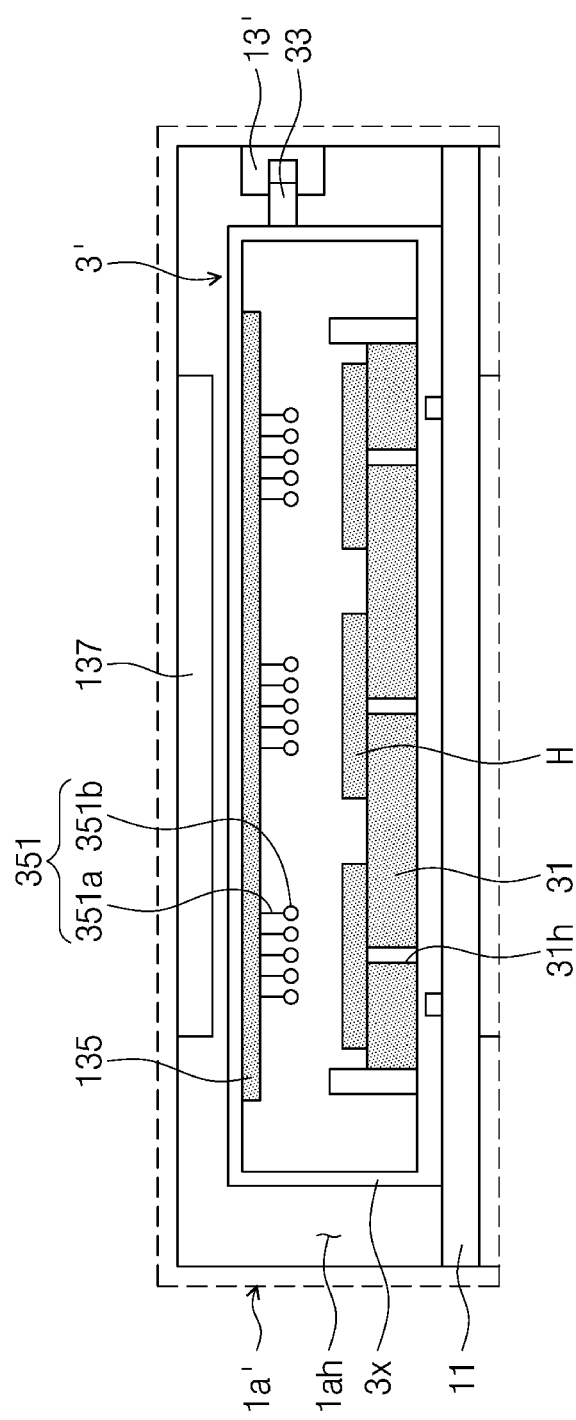
FIG. 15 illustrates a front view showing a test pack according to embodiments of the present inventive concept.

FIG. 14 illustrates a front view showing a semiconductor package test system according to embodiments of the present inventive concept. FIG. 15 illustrates a front view showing a test pack according to embodiments of the present inventive concept.

In the description that follows, for convenience of explanation, a further description of content substantially the same as or similar to content described with reference to FIGS. 1 to 13 may be omitted.

Referring to FIG. 14, a tester 1' may include a test substrate 137. For example, the test substrate 137 may be disposed in each receiving section 1*a'*. Differently from that described with reference to FIGS. 2 and 3, the test substrate 137 may be positioned not in the test pack 3 (see FIG. 3), but rather, in the receiving section 1*a'*. For example, the test substrate 137 may be positioned on a ceiling of the receiving section 1*a'*. Embodiments of the present inventive concept, however, are not limited thereto. For example, in embodiments, the test substrate 137 may be disposed in a different position in each receiving section 1*a'*.

Referring to FIG. 15, a test pack 3' may be inserted into the receiving section 1*a'*. When the test pack 3' is inserted into the receiving section 1*a'*, the connection terminal 33 and the receiving terminal 13' may be electrically connected to each other. A test signal may be transmitted from the test substrate 137 through the connection terminal 33 to a probe block 135. For example, when the test pack 3' is inserted into the receiving section 1*a'*, the probe block 135 in the test pack 3' may be electrically connected to the test substrate 137 in the receiving section 1*a'*, and thus, a signal may flow between the probe block 135 and the test substrate 137. A test process may be performed on the semiconductor package H.

Figure 16:
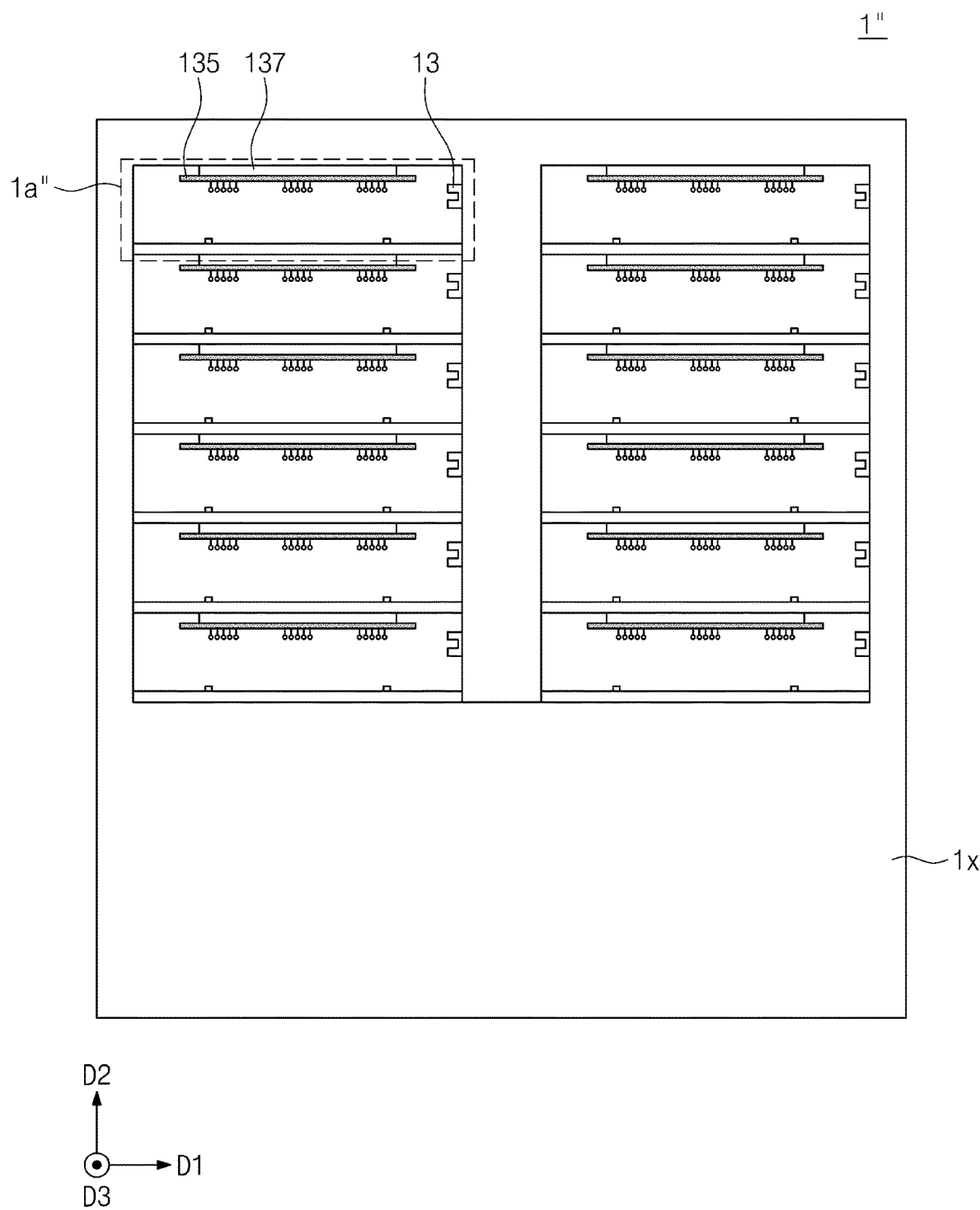
FIG. 16 illustrates a front view showing a semiconductor package test system according to embodiments of the present inventive concept.
Figure 17:
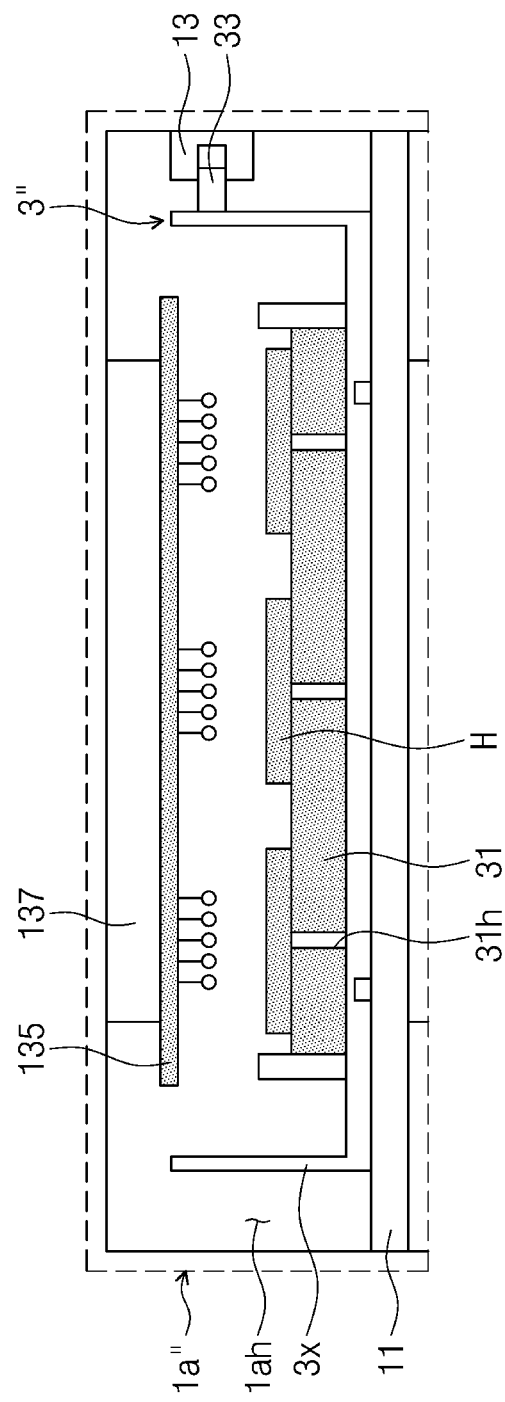
FIG. 17 illustrates a front view showing a test pack according to embodiments of the present inventive concept.

FIG. 16 illustrates a front view showing a semiconductor package test system according to embodiments of the present inventive concept. FIG. 17 illustrates a front view showing a test pack according to embodiments of the present inventive concept.

In the description that follows, for convenience of explanation, content substantially the same as or similar to content described with reference to FIGS. 1 to 15 may be omitted.

Referring to FIG. 16, a tester 1" may include a test substrate 137 and a probe block 135. For example, the test substrate 137 and the probe block 135 may be disposed in each receiving section 1*a"*. Differently from that described with reference to FIGS. 2 and 3, the test substrate 137 and the probe block 135 may be positioned not in the test pack 3 (see FIG. 3), but rather, in the receiving section 1*a"*. For example, the test substrate 137 and the probe block 135 may be positioned on a ceiling of the receiving section 1*a"*. Embodiments of the present inventive concept, however, are not limited thereto. For example, in embodiments, the test substrate 137 and the probe block 135 may be disposed in a different position in each receiving section 1*a"*.

Referring to FIG. 17, the pack housing 3x of a test pack 3" may have an opened upper portion. The opened upper portion may allow the probe block 135 of the receiving section 1a" to contact the semiconductor package H. Accordingly, a test process may be performed on the semiconductor package H.

According to a semiconductor package and a semiconductor package fabrication method in accordance with embodiments of the present inventive concept, a probe block and a test substrate may be positioned in a tester. Therefore, a test pack may have a simplified configuration, and the semiconductor package may be conveniently placed on a chuck of the test pack.

Figure 18:
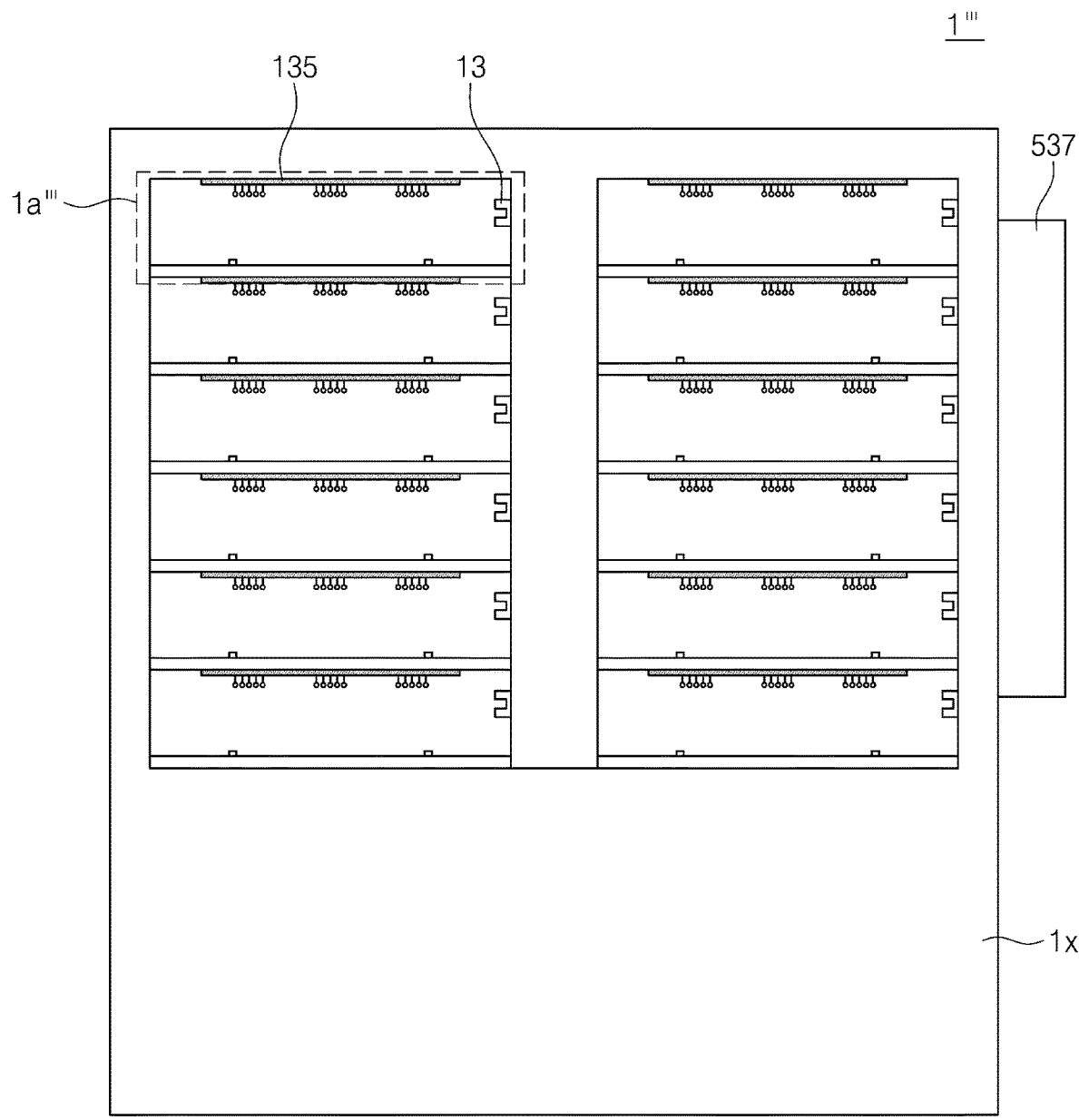
FIG. 18 illustrates a front view showing a semiconductor package test system according to embodiments of the present inventive concept.

FIG. 18 illustrates a front view showing a semiconductor package test system according to embodiments of the present inventive concept.

In the description that follows, for convenience of explanation, content substantially the same as or similar to content described with reference to FIGS. 1 to 17 may be omitted.

Referring to FIG. 18, a tester 1''' may include an integration test substrate 537 and a probe block 135. For example, the probe block 135 may be disposed in each receiving section 1a''', and the integration test substrate 537 that generally controls the probe blocks 135 may be separately provided outside the receiving sections 1a'''. The integration test substrate 537 may use a separate circuit to control the probe block 135 disposed in each receiving section 1a'''. Although an embodiment in which the integration test substrate 537 is included in the tester 1''' has been described, embodiments of the present inventive concept are not limited thereto. For example, in embodiments, the integration test substrate 537 may use existing automatic test equipment (ATE). For example, the ATE may be electrically connected to the tester 1''', and the tester 1''' may receive test signals from the ATE.

Figure 19:
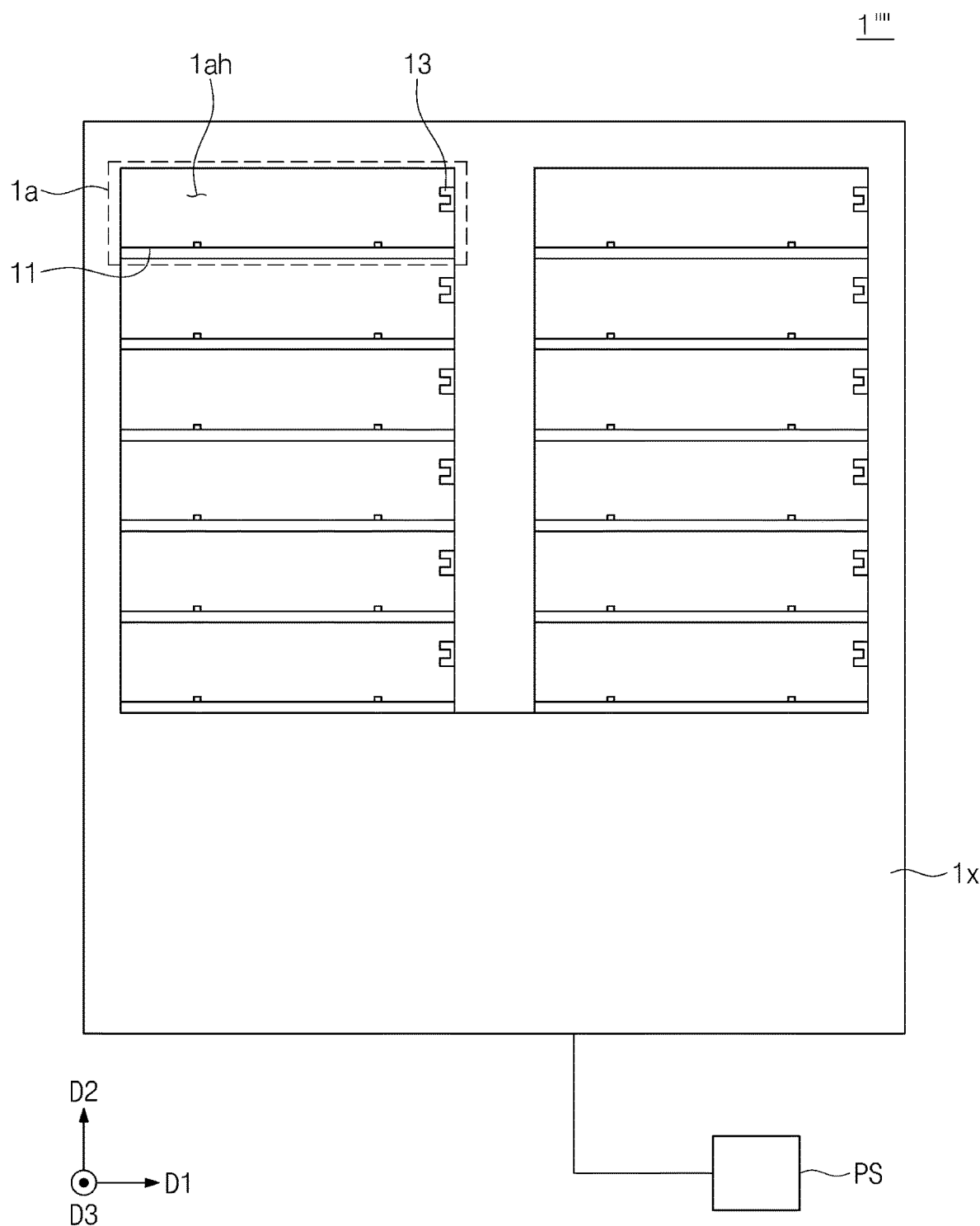
FIG. 19 illustrates a front view showing a semiconductor package test system according to embodiments of the present inventive concept.

FIG. 19 illustrates a front view showing a semiconductor package test system according to embodiments of the present inventive concept.

In the description that follows, for convenience of explanation, content substantially the same as or similar to content described with reference to FIGS. 1 to 18 may be omitted.

Referring to FIG. 19, a tester 1'''' may be connected to a power supply PS that is separately provided. When a large power is required to perform a test process on a semiconductor package, a power supply equipped in the tester 1''' may not be enough to supply a sufficient power. In this case, in an embodiment, a test power may be supplied from the power supply PS that is separately present outside of the tester 1''''. Therefore, the tester 1''' may have a simplified configuration. In addition, sufficient test power may be supplied.

According to a semiconductor package test system and a semiconductor package fabrication method using the same in accordance with embodiments of the present inventive concept, a large quantity of semiconductor packages may be quickly tested.

According to a semiconductor package test system and a semiconductor package fabrication method using the same in accordance with embodiments of the present inventive concept, work time may be reduced.

According to a semiconductor package test system and a semiconductor package fabrication method using the same in accordance with embodiments of the present inventive concept, yield may be increased.

According to a semiconductor package test system and a semiconductor package fabrication method using the same in accordance with embodiments of the present inventive concept, a semiconductor package may undergo a test process at various temperature ranges.

While the present inventive concept has been particularly shown and described with reference to the embodiments thereof, it will be understood by those of ordinary skill in the art that various changes in form and detail may be made therein without departing from the spirit and scope of the present inventive concept as defined by the following claims.

What is claimed is:

1. A semiconductor package test system, comprising:
   a test pack on which a semiconductor package is loaded; and
   a semiconductor package testing apparatus,
   wherein the semiconductor package testing apparatus includes a receiving section that receives the test pack,
   the receiving section includes a pack receiving slot into which the test pack is inserted, the test pack includes:
      a chuck on which the semiconductor package is fixed;
      a probe block disposed above the chuck; and
      a connection terminal,
   the receiving section includes a receiving terminal that is electrically connected to the connection terminal when the receiving terminal contacts the connection terminal,
   the probe block includes at least one needle configured to be electrically connected to the semiconductor package disposed on the chuck upon the chuck moving toward the semiconductor package, and
   the receiving section is provided in plural.

2. The semiconductor package test system of claim 1, further comprising:
   a vacuum pump,
   wherein the chuck includes a vacuum hole that fixes the semiconductor package to the chuck via a vacuum pressure provided through the vacuum hole by the vacuum pump.

3. The semiconductor package test system of claim 2, wherein
   the vacuum hole is provided in plural, and
   the vacuum holes are spaced apart from each other in a horizontal direction.

4. The semiconductor package test system of claim 1, wherein the test pack further includes a test substrate electrically connected to the probe block.

5. The semiconductor package test system of claim 1, wherein each of the plurality of receiving sections further includes a test substrate,
   wherein, when the test pack is inserted into the pack receiving slot, the test substrate is electrically connected to the probe block through the receiving terminal and the connection terminal.

6. The semiconductor package test system of claim 1, wherein each of the plurality of receiving sections further includes a support plate that supports the test pack,
   wherein the support plate includes a hot wire,
   wherein a temperature of the hot wire is changed in response to a power applied to the hot wire.

7. The semiconductor package test system of claim 6, wherein the support plate includes a cooling path.

8. The semiconductor package test system of claim 1, further comprising:
   a power supply that supplies the probe block with a power.

9. The semiconductor package test system of claim 1, wherein the chuck is vertically movable to cause the semiconductor package on the chuck to contact the at least one needle of the probe block.

10. The semiconductor package test system of claim 1, wherein the receiving sections are vertically stacked in the semiconductor package testing apparatus.

11. A semiconductor package test system, comprising:
a test pack on which a memory chip is loaded; and
a semiconductor package testing apparatus,
wherein
the semiconductor package testing apparatus includes a receiving section that receives the test pack,
the receiving section includes a pack receiving slot into which the test pack is inserted,
the receiving section is provided in plural, and the plurality of receiving sections is vertically stacked in the semiconductor package testing apparatus,
the test pack includes a chuck on which the memory chip is fixed, and
the chuck includes a vacuum hole that fixes the memory chip to the chuck.

12. The semiconductor package test system of claim 11, wherein the test pack further includes:
a probe block disposed above the chuck; and
a connection terminal,
wherein each of the plurality of receiving sections further includes a receiving terminal that is electrically connected to the connection terminal when the receiving terminal contacts the connection terminal,
wherein the probe block includes at least one needle configured to contact a test pad of the memory chip and electrically connect to the memory chip upon the chuck moving toward the memory chip.

13. The semiconductor package test system of claim 11, wherein each of the plurality of receiving sections further includes a probe block.

14. The semiconductor package test system of claim 13, wherein each of the plurality of receiving sections further includes a test substrate electrically connected to the probe block.

15. The semiconductor package test system of claim 11, wherein each of the plurality of receiving sections further includes a support plate that supports the test pack,
wherein the support plate includes a hot wire or a cooling path,
wherein a temperature of the hot wire is changed in response to a power applied to the hot wire.

16. A semiconductor package fabrication method, comprising:
cutting a wafer into a divided semiconductor package;
placing the divided semiconductor package on a chuck of a test pack;
inserting the test pack into a pack receiving slot in a receiving section of a semiconductor package testing apparatus; and
testing the semiconductor package disposed on the test pack using the semiconductor package testing apparatus,
wherein testing the semiconductor package includes:
moving a needle of a probe block toward the semiconductor package such that the needle contacts the semiconductor package;
applying a test power from the semiconductor package testing apparatus to the test pack; and
performing a test on the semiconductor package using the test power.

17. The semiconductor package fabrication method of claim 16, wherein
the semiconductor package includes a test pad exposed on a surface of the semiconductor package, and
moving the needle of the probe block to contact the semiconductor package includes causing the needle to contact the test pad.

18. The semiconductor package fabrication method of claim 16, wherein the semiconductor package includes a high bandwidth memory (HBM).

19. The semiconductor package fabrication method of claim 16, wherein placing the divided semiconductor package on the chuck of the test pack includes:
providing, by a vacuum pump, a vacuum pressure to the chuck; and
fixing the semiconductor package on the chuck using the vacuum pressure.

20. The semiconductor package fabrication method of claim 16, wherein applying the test power from the semiconductor package testing apparatus to the test pack includes supplying a test substrate of the test pack with the test power that is transmitted through a receiving terminal of the receiving section and a connection terminal of the test pack.

* * * * *